US009557484B1

(12) United States Patent
Norberg et al.

(10) Patent No.: US 9,557,484 B1
(45) Date of Patent: Jan. 31, 2017

(54) HIGH-EFFICIENCY OPTICAL WAVEGUIDE TRANSITIONS

(71) Applicant: Aurrion, Inc., Goleta, CA (US)

(72) Inventors: Erik Johan Norberg, Santa Barbara, CA (US); Jonathan Edgar Roth, Santa Barbara, CA (US)

(73) Assignee: Aurrion, Inc., Goleta, CA (US)

( * ) Notice: Subject to any disclaimer, the term of this patent is extended or adjusted under 35 U.S.C. 154(b) by 0 days.

(21) Appl. No.: 14/537,609

(22) Filed: Nov. 10, 2014

Related U.S. Application Data (60) Provisional application No. 61/936,504, filed on Feb. 6, 2014.

(51) Int. Cl.
*G02B 6/26* (2006.01)

(52) U.S. Cl.
CPC ........................................ *G02B 6/26* (2013.01)

(58) Field of Classification Search
CPC ............. G02B 6/26; G02B 6/122; G02B 6/13
See application file for complete search history.

(56) References Cited

U.S. PATENT DOCUMENTS

| | | | | |
|---|---|---|---|---|
| 5,528,616 | A * | 6/1996 | Kash et al. | 372/45.01 |
| 6,341,189 | B1 | 1/2002 | Deacon | |
| 6,631,225 | B2 * | 10/2003 | Lee | B82Y 20/00 385/28 |
| 6,791,675 | B2 * | 9/2004 | Kikuchi | G02B 6/12004 356/131 |
| 6,870,987 | B2 * | 3/2005 | Lee | G02B 6/132 385/28 |
| 6,937,342 | B2 * | 8/2005 | Osinski | G01C 19/72 356/461 |
| 6,987,913 | B2 * | 1/2006 | Blauvelt | G02B 6/12002 385/28 |
| 7,035,524 | B2 * | 4/2006 | Aoki et al. | 385/140 |

(Continued)

FOREIGN PATENT DOCUMENTS

| EP | 2879250 A1 * | 6/2015 |
|---|---|---|
| WO | WO 0216979 A2 * | 2/2002 |

OTHER PUBLICATIONS

Bauters et al. "Silicon on ultra-low-loss waveguide photonic integration platform,", Optics Express, vol. 21, Issue 1, Jan. 14, 2013.*

(Continued)

*Primary Examiner* — Peter Radkowski
(74) *Attorney, Agent, or Firm* — Schwegman Lundberg & Woessner, P.A.

(57) ABSTRACT

Embodiments describe high-efficiency optical waveguide transitions—i.e., creating heterogeneous transitions between Si and III-V semiconductor regions or devices with minimal reflections. This is advantageous for III-V device performance, e.g. for an on-chip lasers achieving lower relative intensity noise (RIN) and lower phase noise by avoiding reflections, higher gain and reduced gain-ripple from an semiconductor optical amplifier (SOA) by avoiding internal reflections in the SOA. Furthermore, in some embodiments, generated photocurrent can be used as a monitor signal for control purposes, thereby avoiding the use of separate tap-monitor photodetectors, which provide additional link loss.

22 Claims, 6 Drawing Sheets

(56) References Cited

U.S. PATENT DOCUMENTS

| | | | |
|---|---|---|---|
| 7,103,245 B2* | 9/2006 | Lee | G02B 6/10 385/28 |
| 7,224,881 B2* | 5/2007 | Aoki et al. | 385/140 |
| 7,532,379 B2* | 5/2009 | Miller et al. | 359/245 |
| 7,826,059 B2* | 11/2010 | Roth et al. | 356/450 |
| 8,463,088 B1 | 6/2013 | Asghari et al. | |
| 8,615,146 B2* | 12/2013 | Nagano et al. | 385/14 |
| 8,736,953 B2* | 5/2014 | Savage-Leuchs | 359/337 |
| 8,744,222 B2* | 6/2014 | Lee et al. | 385/28 |
| 8,855,449 B1* | 10/2014 | Roth | 385/11 |
| 8,948,555 B1* | 2/2015 | Roth et al. | 385/45 |
| 9,042,686 B2* | 5/2015 | Kim et al. | 385/14 |
| 9,217,836 B2* | 12/2015 | Asghari | G02B 6/423 |
| 2002/0031296 A1* | 3/2002 | Lee | B82Y 20/00 385/28 |
| 2002/0064345 A1* | 5/2002 | Kikuchi | G02B 6/12004 385/50 |
| 2002/0196446 A1* | 12/2002 | Roth et al. | 356/479 |
| 2003/0012493 A1* | 1/2003 | Lee | G02B 6/10 385/28 |
| 2003/0030814 A1* | 2/2003 | Osinski | G01C 19/72 356/461 |
| 2003/0081902 A1* | 5/2003 | Blauvelt | G02B 6/12002 385/50 |
| 2004/0037497 A1* | 2/2004 | Lee | G02B 6/132 385/28 |
| 2004/0126079 A1* | 7/2004 | Aoki et al. | 385/140 |
| 2005/0207721 A1* | 9/2005 | Aoki et al. | 385/140 |
| 2009/0086302 A1* | 4/2009 | Miller et al. | 359/245 |
| 2011/0109914 A1* | 5/2011 | Roth et al. | 356/492 |
| 2011/0110629 A1* | 5/2011 | Nagano et al. | 385/48 |
| 2011/0249319 A1* | 10/2011 | Savage-Leuchs | 359/341.1 |
| 2013/0028557 A1* | 1/2013 | Lee et al. | 385/28 |
| 2013/0163916 A1* | 6/2013 | Kim et al. | 385/14 |
| 2013/0209033 A1* | 8/2013 | Luff | G02B 6/1228 385/28 |
| 2013/0209112 A1* | 8/2013 | Witzens | 398/214 |
| 2013/0229809 A1* | 9/2013 | Hatori et al. | 362/311.01 |
| 2014/0064658 A1* | 3/2014 | Ramaswamy et al. | 385/14 |
| 2014/0133864 A1* | 5/2014 | Asghari | G02B 6/423 398/141 |
| 2014/0254978 A1* | 9/2014 | Koch et al. | 385/14 |
| 2015/0104130 A1* | 4/2015 | Anderson et al. | 385/28 |
| 2015/0124845 A1* | 5/2015 | Koch et al. | 370/542 |

OTHER PUBLICATIONS

Dai et al., "Mode conversion in tapered submicron silicon ridge optical waveguides," Opt. Express 20, 13425-13439 (2012).*
"European Application Serial No. 15000349.9, Extended European Search Report mailed Jun. 9, 2015", 7 pgs.
"European Application Serial No, 15000349.9, Office Action mailed Oct. 23, 2015", 1 pg.

* cited by examiner

HIGH-EFFICIENCY OPTICAL WAVEGUIDE TRANSITIONS

PRIORITY

This application claims the benefit of U.S. Provisional Application No. 61/936,504 filed Feb. 6, 2014, the entire contents of which are hereby incorporated by reference herein.

FIELD

Embodiments of the disclosure generally pertain to the optical devices and more specifically to enhanced efficiency for optical waveguide transitions.

BACKGROUND

Optical devices may be formed from heterogeneous materials—i.e., two or more different semiconductor materials. The efficiency of coupling light between these semiconductor materials is limited by the fabrication processes associated with each material. These limitations introduce loss and other operations inefficiencies, such as reflections, into an optical device comprising heterogeneous materials.

BRIEF DESCRIPTION OF THE DRAWINGS

The following description includes discussion of figures having illustrations given by way of example of implementations of embodiments of the disclosure. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein. An overview of embodiments of the disclosure is provided below, followed by a more detailed description with reference to the drawings.

DESCRIPTION

Embodiments of the disclosure describe high efficiency optical waveguide transitions for heterogeneous optical devices. Throughout this specification, several terms of art are used. These terms are to take on their ordinary meaning in the art from which they come, unless specifically defined herein or the context of their use would clearly suggest otherwise. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Figure 1:
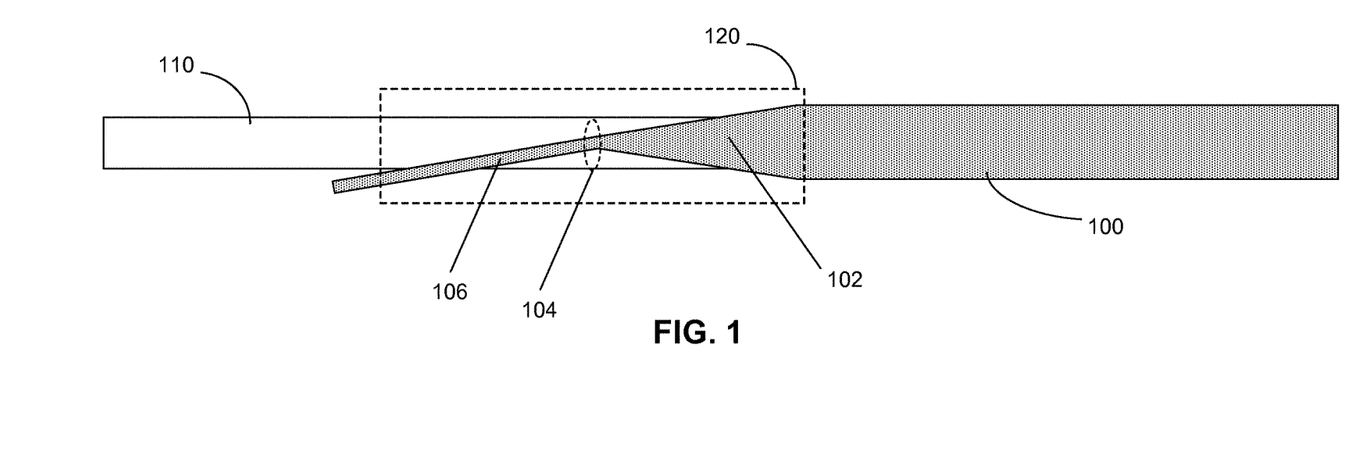
FIG. 1 is an illustration of a waveguide coupling region according to an embodiment of the invention.

FIG. 1 is an illustration of a waveguide coupling region according to an embodiment of the invention. In this embodiment, waveguide 100 comprises a first semiconductor material and is shown to be disposed on top of waveguide 110, which comprises a second (different) semiconductor material; for example, waveguide 100 may comprise III-V semiconductor material, and waveguide 110 may comprise silicon semiconductor material. The description below pertains to light being coupled to waveguide 110 from waveguide 100 at region 120. As shown in this figure, region 120 may include coupling where angled taper 106 (described below) overlaps waveguide 110.

Waveguide 100 includes taper 102 to adiabatically transform (i.e., laterally confine) the optical mode of light so that it may be coupled to silicon waveguide 110. As referred to herein, a waveguide transition is adiabatic if it occurs sufficiently slowly so as not to transfer energy from the occupied mode to other modes. Section 104 is illustrated as the smallest width of taper 102. Processing limitations limit how much section 104 may be minimized; in other words, the smallest width of taper 102 cannot be made infinitely small, and therefore this width may create reflections back towards waveguide 100 if section 104 comprises an edge (i.e., a blunt end). Such tapers are alternatively referred to herein as an unterminated port. The reflected light caused by unterminated ports may affect device performance, such as noise. Furthermore, light reflected by an unterminated port back into waveguide 100 towards an active region may create an unintended lasing effect.

In this embodiment, region 106 is to receive light from waveguide 100 that was not coupled into waveguide 110. This region is designed to avoid back-reflections into the fundamental mode and/or other higher order guided modes of waveguide 100 (and thus back into the device). Thus, embodiments of the invention minimize reflections at transitions between heterogeneous semiconductor materials. This is advantageous for optic device performance, e.g. for an on-chip laser achieving lower relative intensity noise (RIN) and lower phase noise by avoiding reflections.

Region 106 is shown in this embodiment to comprise a width equal to width 104. This region in other embodiments may comprise a larger width than width 104. The length of this region may vary across different embodiments of the invention; for example, said region may comprise a long length designed to create loss for any received light. Other embodiments may include a structure at the end of this region to enhance loss to ensure any received light does not propagate back towards the emitting waveguide.

Figure 2A:
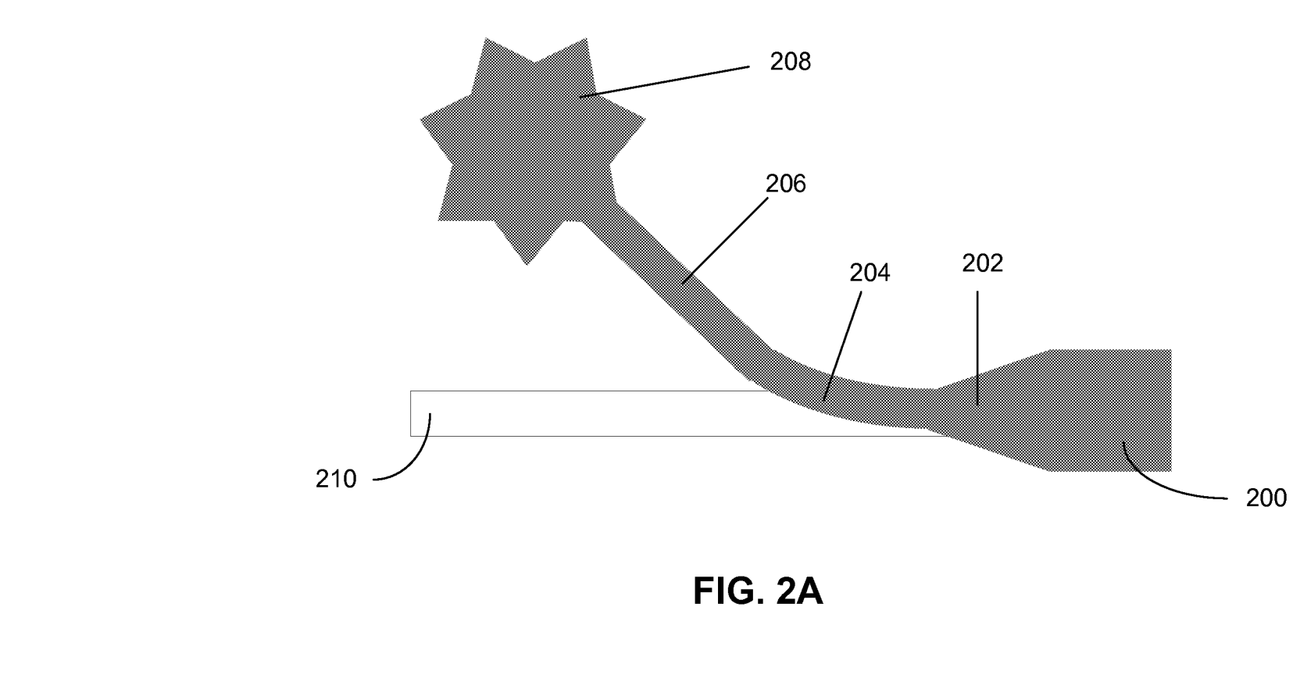
FIG. 2A-FIG. 2B are illustrations of waveguide coupling regions including structures to enhance optical signal loss according embodiments of the invention.
Figure 2B:
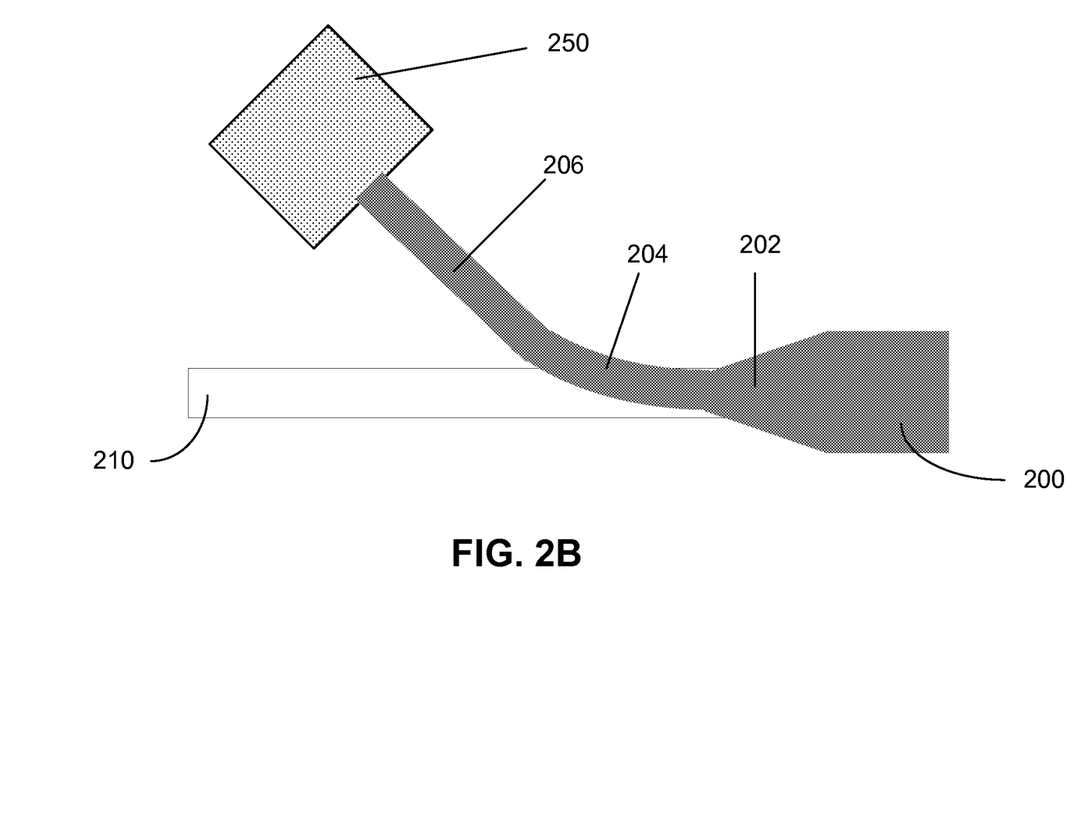

FIG. 2A-FIG. 2B are illustrations of waveguide coupling regions including structures to enhance optical signal loss according embodiments of the invention. In this embodiment, waveguide 200 comprises a first semiconductor material, and is shown to be disposed on top of waveguide 210 which comprises a second semiconductor material different than the first. Waveguide 200 includes taper 202 to laterally confine the optical mode of light so that it may be coupled to waveguide 210.

As described above, fabrication limitations may prevent all light from being coupled to waveguide 210 from waveguide 200. Region 206 is to receive light from waveguide 200 that is not coupled into waveguide 210. In this embodiment, at the end of region 206, structure 208 is utilized to eliminate light received from region 206. Structure 208 is shown to comprise a passive structure—in this example, star-shaped structure where light is diffracted from the input and then coupled into radiation modes of the surrounding cladding (e.g., air) by means of the sharp tips of the structure (i.e., the vertices of the polygonal shape of structure 208). Other embodiments may utilize any polygonal or circular structure in place of structure 208.

Embodiments of the invention may utilize any passive structure designed to enhance loss or absorption of the received optical light, couple the light into radiation or higher order modes—or any other functionally equivalent means for lowering back-reflections for the device. Examples of passive structures other than illustrated structure 208 include an extension of section 206 at a narrow width to enhance scattering loss, a free propagation region, an angled taper tip at the end of section 206 for coupling light into radiation modes, large slab like regions at the end of section 206 to promote diffraction of light, or any other functionally equivalent structures.

In this embodiment, waveguides 200 and 210 are separated laterally via section 204 of waveguide 200. Section 204 is shown to be between the above described waveguide sections 202 and 206. The lateral separation of waveguides 200 and 210 provided by waveguide section 204 helps avoid perturbing the mode of waveguide 210 with structure 208; however, in other embodiments, there is no lateral separation between the two waveguides (e.g., an embodiment may have sections similar to those of 204, 206 and 208 aligned with waveguide 210).

FIG. 2B illustrates the waveguide coupling region of FIG. 2A with active structure 250 replacing passive structure 208. Active structures may comprise electrical contacts to enhance the absorption of light received from region 206 (e.g., either grounding the electrical contacts on both sides or adding a reverse bias to the diode active structure 250). In some embodiments, electrical contacts may be disposed on section 204, region 206 and/or structure 250. In some embodiments, structure 250 may comprise a photodetecting element to detect light received from region 206. These embodiments may eliminate an instance of a monitor photodetector (and associated optical tap) while also eliminating light not received by waveguide 200. The above described photodetecting structure may be used, for example, for feedback control purposes (e.g., controlling a device coupled to waveguide 200).

Figure 3:
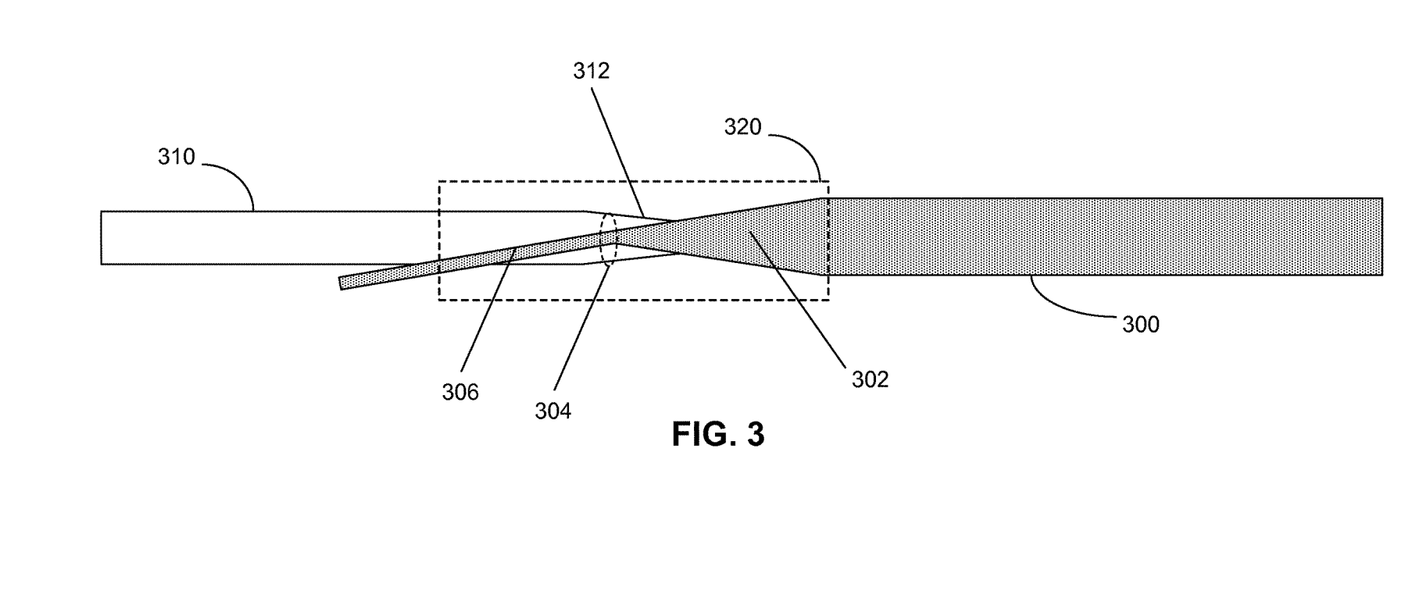
FIG. 3 is an illustration of a waveguide coupling region for heterogeneous materials according to an embodiment of the invention.

FIG. 3 is an illustration of a waveguide coupling region for heterogeneous materials according to an embodiment of the invention. In this embodiment, waveguide 300 comprises a first semiconductor material, and is shown to be disposed on top of waveguide 310 which comprises a second semiconductor material different than the first. The description below pertains to light being coupled to waveguide 300 from waveguide 310 at region 320. As shown in this figure, region 320 may include coupling where angled taper 306 (described below) overlaps waveguide 310.

Region 320 comprises an optimized heterogeneous taper with mirror symmetry along the axis of propagation. Waveguide 300 includes taper 302 to laterally confine the optical mode of light so that it may be coupled to waveguide 310. Waveguide 310 also includes taper 312 to confine the optical mode of the light received from waveguide 300. Tapering the widths of both waveguides is used to adiabatically transform the mode of the light from waveguide 310 to waveguide 300.

For this type of coupling region, the efficiency of the transfer of light between waveguides—i.e., minimizing back reflections towards waveguide 300, is determined by the smallest width of taper 302 (i.e., width 304). Minimizing this width to ensure efficiency may be unattainable via some fabrication techniques, leading to high back reflection and/or high insertion loss. Furthermore, in some embodiments, an insufficiently small dimension for width 304 may also be incompatible with electrical pumping of a gain material, leading to optical loss.

In this embodiment, structure 306 provides a lateral offset for the axis of propagation between waveguides 310 and 300, thereby reducing the constraint of the minimum dimension for width 304 of taper 302 light is transferred from waveguide 310 to waveguide 300. The lateral offset provided by structure 306 is used to maintain continuity and complete the transition of the modes between the semiconductor materials without an abrupt interface that would cause modal mismatch or back reflections, thereby providing for an efficient coupling between the waveguides.

In other embodiments, the above described lateral offset may be provided by the placement of the receiving waveguide, and the initial receiving region (i.e., a region similar to region 306) may be placed in-line with the emitting waveguide.

To obtain efficient adiabatic transfer from waveguide 310 to waveguide 300, the effective index of structure 306 where it is separated laterally from waveguide 310 may be lower than the effective index of waveguide 310; this effective index difference permits efficient adiabatic mode transfer between the two waveguides. In embodiments where waveguide 300 comprises a tapered gain waveguide, because the minimum width constraint of width 304 of taper 302 can be relaxed, it is possible to pump the entire length of the taper where light interacts with the gain material. In some embodiments, structure 306 is electrically pumped so that no loss in introduced due to coupling.

Figure 4:
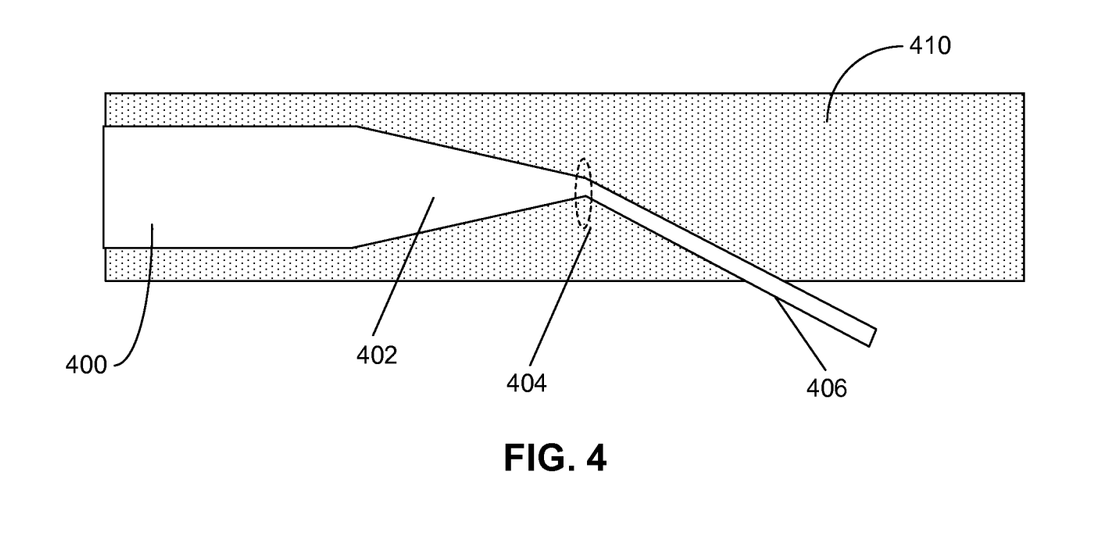
FIG. 4 is an illustration of a waveguide coupling region for a spot size converter according to an embodiment of the invention.

FIG. 4 is an illustration of a waveguide coupling region for a spot size converter according to an embodiment of the invention. In this embodiment, the illustrated waveguide coupling region comprises a spot size converter for different semiconductor materials, wherein waveguide 400 receives light from waveguide 410. In this embodiment, the material of waveguide 410 comprises a lower refractive index and thus has a larger spot size.

For example, waveguide 400 may comprise silicon semiconductor material, while waveguide 410 may comprise silicon nitride (SiN) material. Waveguide 400 is shown to include taper 402 to transfer energy from waveguide 410; for example, the widths of this taper may be selected such that the TE0 mode in the material of waveguide 410 is transferred to a TE0 mode of the material of waveguide 400, and the TM0 mode in the material of waveguide 410 is transferred to a TE1 mode in the material of waveguide 400.

In some embodiments, there is a large refractive index difference between the different materials of the waveguides, meaning the dimensions of smallest width 404 of taper 402 to ensure optical coupling may be difficult to fabricate with photolithography. The use of the lateral offset to waveguide 400 provided by structure 406 relaxes the constraint on width 404, as the modal mismatches and back reflections from insufficiently small widths are eliminated.

Figure 5:
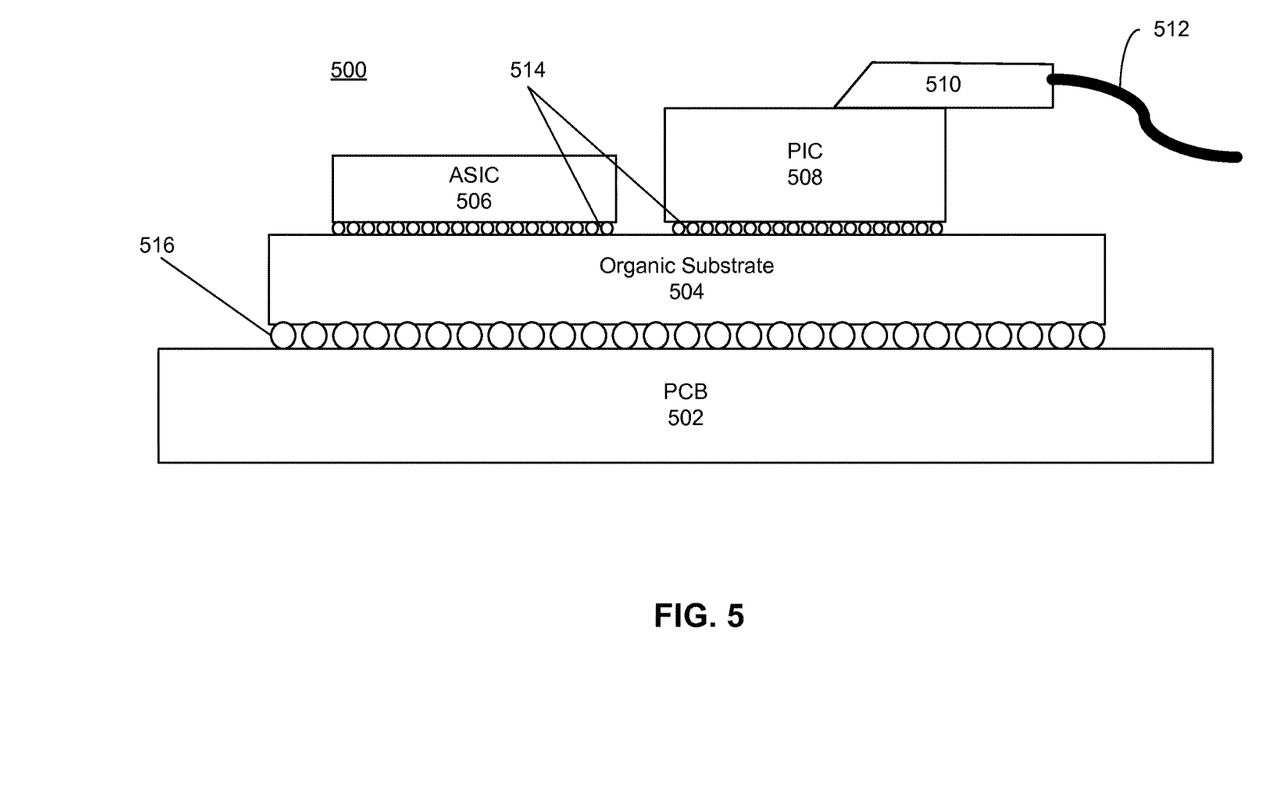
FIG. 5 is an illustration of a system including one or more high efficiency optical waveguide transitions according to an embodiment of the invention.

FIG. 5 is an illustration of a system including one or more high efficiency optical waveguide transitions according to an embodiment of the invention. In this embodiment, system 500 is shown to include printed circuit board (PCB) substrate 502, organic substrate 504, application specific integrated circuit (ASIC) 506, and PIC 508. PIC 508 exchanges light with fiber 512 via prism 510; said prism is a misalignment-tolerant device used to couple an optical mode on to a single mode optical fiber. The optical devices of PIC 508 are controlled, at least in part, by control circuitry included in ASIC 506. As discussed above, the efficiency of optical couplings between the components described above may be limited by processing fabrication techniques. System 500 may include any of the waveguide transitions discussed above.

Both ASIC 506 and PIC 508 are shown to be disposed on copper pillars 514, which are used for communicatively coupling the ICs via organic substrate 504. PCB 502 is coupled to organic substrate 504 via ball grid array (BGA) interconnect 516, and may be used to interconnect the organic substrate (and thus, ASIC 506 and PIC 508) to other components of system 500 not shown—e.g., interconnection modules, power supplies, etc.

Reference throughout the foregoing specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout the specification are not necessarily all referring to the same embodiment. Furthermore, the particular features, structures or characteristics may be combined in any suitable manner in one or more embodiments. In addition, it is appreciated that the figures provided are for explanation purposes to persons ordinarily skilled in the art and that the drawings are not necessarily drawn to scale. It is to be understood that the various regions, layers and structures of figures may vary in size and dimensions.

The above described embodiments of the disclosure may comprise SOI or silicon based (e.g., silicon nitride (SiN)) devices, or may comprise devices formed from both silicon and a non-silicon material. Said non-silicon material (alternatively referred to as "heterogeneous material") may comprise one of III-V material, magneto-optic material, or crystal substrate material.

III-V semiconductors have elements that are found in group III and group V of the periodic table (e.g., Indium Gallium Arsenide Phosphide (InGaAsP), Gallium Indium Arsenide Nitride (GaInAsN)). The carrier dispersion effects of III-V based materials may be significantly higher than in silicon based materials, as electron speed in III-V semiconductors is much faster than that in silicon. In addition, III-V materials have a direct bandgap which enables efficient creation of light from electrical pumping. Thus, III-V semiconductor materials enable photonic operations with an increased efficiency over silicon for both generating light and modulating the refractive index of light.

Thus, III-V semiconductor materials enable photonic operation with an increased efficiency at generating light from electricity and converting light back into electricity. The low optical loss and high quality oxides of silicon are thus combined with the electro-optic efficiency of III-V semiconductors in the heterogeneous optical devices described below; in embodiments of the disclosure, said heterogeneous devices utilize low loss heterogeneous optical waveguide transitions between the devices' heterogeneous and silicon-only waveguides.

Magneto-optic materials allow heterogeneous PICs to operate based on the magneto-optic (MO) effect. Such devices may utilize the Faraday Effect, in which the magnetic field associated with an electrical signal modulates an optical beam, offering high bandwidth modulation, and rotates the electric field of the optical mode enabling optical isolators. Said magneto-optic materials may comprise, for example, materials such as such as iron, cobalt, or yttrium iron garnet (YIG).

Crystal substrate materials provide heterogeneous PICs with a high electro-mechanical coupling, linear electro optic coefficient, low transmission loss, and stable physical and chemical properties. Said crystal substrate materials may comprise, for example, lithium niobate ($LiNbO_3$) or lithium tantalate ($LiTaO_3$).

Embodiments of the disclosure describe an apparatus comprising a first waveguide comprising a first semiconductor or dielectric material, a second waveguide disposed over the first waveguide and to transfer light to the first waveguide, the second waveguide comprising a second semiconductor or dielectric material different than the first semiconductor or dielectric material, and including a first region aligned with the first waveguide, and a second region laterally offset from the first region. At least one of the first waveguide or the second waveguide includes a tapered region to adiabatically transfer light between the first and second waveguides, and wherein the second region of the second waveguide is to receive light not coupled to the first waveguide.

In some embodiments, the second region of the second waveguide comprises a smaller cross-sectional area than the first region of the second waveguide, wherein the second waveguide includes the tapered region to adiabatically transfer light between the first and second waveguides, and wherein the tapered region couples the first and second regions of the second waveguide. In some embodiments, the first and second regions of the second waveguide comprise a same cross-sectional area, and the tapered region is included in the first waveguide. In some embodiments, the width of the second region of the second waveguide is equal to a smallest width of the tapered region of the second waveguide.

In some embodiments, the apparatus further comprises electrical contacts disposed on the second region of the second waveguide to enhance optical signal loss of the received light not coupled to the first waveguide. In some embodiments, the electrical contacts are to receive a reverse bias to enhance an absorption of the received light.

In some embodiments, the apparatus further comprises a structure coupled to the second region of the second waveguide to enhance optical signal loss of the received light not coupled to the first waveguide. In some embodiments, the structure comprises an angled edge to terminate the second region and to couple the received light to a radiation mode of a surrounding cladding. In some embodiments, the structure comprises a polygonal structure having a plurality of vertices for coupling the received light to one or more radiation modes of a surrounding cladding. In some embodiments, the structure comprises an active structure to enhance optical signal loss of the received light not coupled to the first waveguide. In some embodiments, the structure includes electrical contacts; in some embodiments, these electrical contacts are to receive a reverse bias to enhance an absorption of the received light. In some embodiments, the structure includes a photodetection layer to absorb the received light; in some of these embodiments, photocurrent generated at the photodetection layer is to be used as a control signal to monitor a device coupled to the second waveguide. In some embodiments, the structure comprises a free propagation region.

In some embodiment, the first waveguide further includes a tapered region to adiabatically receive light from the second waveguide. In some embodiments, the tapered region of the second waveguide is electronically pumped to increase the light coupled to first waveguide.

In some embodiments, the first and second semiconductor or dielectric materials each comprise at least one of III-V semiconductor material, silicon (Si) semiconductor material, or silicon nitride (SiN) dielectric material.

Embodiments of the disclosure describe an apparatus comprising a first waveguide comprising a first semiconductor or dielectric material, a second waveguide disposed over the first waveguide and to receive light from the first waveguide, the second waveguide comprising a second semiconductor or dielectric material different than the first semiconductor or dielectric material, and including a first region, a second region laterally offset from the first region and having a smaller cross-sectional area than the first region, and a tapered region coupling the first and second regions. The tapered region of the second waveguide can further adiabatically receive light from the first waveguide, and at least one of the first region or the second region of the second waveguide can provide a continuous variation of lateral offset between the second waveguide and the first waveguide.

In some embodiments, the first region of the second waveguide is to provide the continuous variation of lateral offset between the second waveguide and the first waveguide. In some embodiments, the second region of the second waveguide is to provide the continuous variation of lateral offset between the second waveguide and the first waveguide. In some embodiments, the apparatus comprises a spot size converter, and wherein the first semiconductor or dielectric material comprises a lower refractive index than the second semiconductor or dielectric material. In some embodiments, the first semiconductor or dielectric material comprises silicon nitride material (SiN) and the second semiconductor or dielectric material comprises silicon (Si) semiconductor material.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

The invention claimed is:

1. An apparatus, comprising:
a first waveguide comprising a first material, the first material being a semiconductor or a dielectric;
a second waveguide disposed over the first waveguide and configured to transfer light to the first waveguide, the second waveguide comprising a second material different from the first material, the second material being a semiconductor or a dielectric, the second waveguide including:
a first region aligned with at least a portion of the first waveguide; and
a second region laterally offset from the first region;

wherein at least one of the first waveguide or the second waveguide includes a tapered region configured to adiabatically transfer light between the first and second waveguides, and
wherein the second region of the second waveguide is configured to receive light not coupled to the first waveguide; and
a structure coupled to the second region of the second waveguide and configured to reduce back-reflections of light from the second region toward the first region.

2. The apparatus of claim 1, wherein:
the second region of the second waveguide comprises a smaller cross-sectional area than the first region of the second waveguide;
the second waveguide includes the tapered region configured to adiabatically transfer light between the first and second waveguides; and
the tapered region couples the first and second regions of the second waveguide.

3. The apparatus of claim 1, wherein:
the first and second regions of the second waveguide have substantially similar cross-sectional areas, and
the tapered region is included in the first waveguide.

4. The apparatus of claim 2, wherein a width of the second region of the second waveguide equals a smallest width of the tapered region of the second waveguide.

5. The apparatus of claim 1, further comprising:
electrical contacts disposed on the second region of the second waveguide and configured to enhance optical signal loss of the received light not coupled to the first waveguide.

6. The apparatus of claim 5, wherein the electrical contacts are configured to receive a reverse bias to enhance an absorption of the received light.

7. The apparatus of claim 1, wherein the structure comprises an angled edge configured to terminate the second region and couple the received light to a radiation mode of a surrounding cladding.

8. The apparatus of claim 1, wherein the structure comprises a polygonal structure having a plurality of vertices configured to couple the received light to one or more radiation modes of a surrounding cladding.

9. The apparatus of claim 1, wherein the structure comprises an active structure configured to enhance optical signal loss of the received light not coupled to the first waveguide.

10. The apparatus of claim 9, wherein the structure includes electrical contacts.

11. The apparatus of claim 10, wherein the electrical contacts are configured to receive a reverse bias to enhance an absorption of the received light.

12. The apparatus of claim 1, wherein the structure includes a photodetection layer configured to absorb the received light.

13. The apparatus of claim 12, wherein photocurrent generated at the photodetection layer is configured to generate a control signal, the control signal configured to monitor a device coupled to the second waveguide.

14. The apparatus of claim 1, wherein the structure comprises a free propagation region.

15. The apparatus of claim 2, wherein the first waveguide further includes a second tapered region configured to adiabatically receive light from the second waveguide.

16. The apparatus of claim 15, wherein the tapered region of the second waveguide is electronically pumped to increase the light coupled to first waveguide.

17. The apparatus of claim 1, wherein the first and second materials each comprise at least one of III-V semiconductor material, silicon (Si) semiconductor material, or silicon nitride (SiN) dielectric material.

18. An apparatus comprising:
a first waveguide comprising a first material, the first material being a semiconductor or a dielectric;
a second waveguide disposed over the first waveguide and configured to receive light from the first waveguide, the second waveguide comprising a second material different from the first material, the second material being a semiconductor or a dielectric the second waveguide including:
a first region;
a second region laterally offset from the first region and having a smaller cross-sectional area than the first region; and
a tapered region coupling the first and second regions;
wherein the tapered region of the second waveguide is configured to further adiabatically receive light from the first waveguide, and
wherein at least one of the first region or the second region of the second waveguide is configured to provide a continuous variation of lateral offset between the second waveguide and the first waveguide; and
a structure coupled to the second region of the second waveguide and configured to reduce back-reflections of light from the second region toward the first region.

19. The apparatus of claim 18, wherein the first region of the second waveguide is configured to provide the continuous variation of lateral offset between the second waveguide and the first waveguide.

20. The apparatus of claim 18, wherein the second region of the second waveguide is configured to provide the continuous variation of lateral offset between the second waveguide and the first waveguide.

21. The apparatus of claim 18, wherein:
the apparatus comprises a spot size converter; and
the first material has a lower refractive index than the second material.

22. The apparatus of claim 21, wherein the first material comprises silicon nitride material (SiN) and the second material comprises silicon (Si) semiconductor material.

* * * * *